United States Patent
Kim et al.

(10) Patent No.: US 7,473,951 B2
(45) Date of Patent: Jan. 6, 2009

(54) MAGNETIC RANDOM ACCESS MEMORY (MRAM) HAVING A MAGNETIC TUNNELING JUNCTION (MTJ) LAYER INCLUDING A TUNNELING FILM OF UNIFORM THICKNESS AND METHOD OF MANUFACTURING THE SAME

(75) Inventors: Tae-wan Kim, Yongin-si (KR); Sang-jin Park, Pyeongtaek-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 13 days.

(21) Appl. No.: 10/948,633

(22) Filed: Sep. 24, 2004

(65) Prior Publication Data
US 2005/0068834 A1 Mar. 31, 2005

(30) Foreign Application Priority Data
Sep. 26, 2003 (KR) .................... 10-2003-0066952

(51) Int. Cl.
*G11C 11/15* (2006.01)
(52) U.S. Cl. .................. 257/296; 257/E21.665; 257/E43.004; 438/238; 438/268; 438/398; 365/222
(58) Field of Classification Search .......... 257/295, 257/296, 297, 314, 315, 325, 326, 367, E27.005, 257/E21.665, E43.004, E43.006; 438/238, 438/268, 398; 365/158, 171, 22, 32, 50, 365/56; 360/290, 324.2, 324.11
See application file for complete search history.

(56) References Cited

U.S. PATENT DOCUMENTS

| | | | |
|---|---|---|---|
| 5,841,692 A | 11/1998 | Gallagher et al. | |
| 6,205,052 B1* | 3/2001 | Slaughter et al. | 365/173 |
| 6,341,053 B1* | 1/2002 | Nakada et al. | 360/324.2 |
| 6,495,275 B2* | 12/2002 | Kamiguchi et al. | 360/324.11 |
| 6,538,919 B1* | 3/2003 | Abraham et al. | 365/171 |
| 6,911,346 B2* | 6/2005 | Ying et al. | 438/3 |
| 2002/0086182 A1* | 7/2002 | Fujikata et al. | 428/692 |

(Continued)

FOREIGN PATENT DOCUMENTS
EP 1 094 329 A2 4/2001

(Continued)

OTHER PUBLICATIONS

Wang, Jianguo, et al., "Continuous thin barriers for low-resistance spin-dependent tunnel junctions", Journal of Applied Physics, vol. 93, No. 10, pp. 8367-8369, (May 15, 2003).

*Primary Examiner*—Thomas L Dickey
*Assistant Examiner*—Fazli Erdem
(74) *Attorney, Agent, or Firm*—Lee & Morse, P.C.

(57) ABSTRACT

A magnetic random access memory (MRAM), and a method of manufacturing the same, includes a cell including a transistor and a magnetic tunneling junction (MTJ) layer connected to the transistor, wherein the MTJ layer includes a lower electrode, a lower magnetic film, a tunneling film having a uniform thickness and a substantially flat upper surface, and an upper magnetic film, wherein the lower electrode includes a first lower electrode and an amorphous second lower electrode. An amorphous flattening film may be further formed between the lower electrode and the lower magnetic film.

15 Claims, 8 Drawing Sheets

U.S. PATENT DOCUMENTS

2002/0177013 A1* 11/2002 Hiramoto et al. ............ 428/702
2003/0021908 A1   1/2003 Nickel et al.
2003/0072109 A1   4/2003 Sharma et al.
2003/0179071 A1   9/2003 Hiramoto et al.
2004/0017639 A1*  1/2004 Deak ........................ 360/290
2004/0026369 A1*  2/2004 Ying et al. .................. 216/63
2004/0184311 A1*  9/2004 Sharma ...................... 365/158
2005/0035383 A1*  2/2005 Ha et al. .................... 257/295

FOREIGN PATENT DOCUMENTS

EP    1 182 713 A2    2/2002

* cited by examiner

+ FLATTENING

MAGNETIC RANDOM ACCESS MEMORY (MRAM) HAVING A MAGNETIC TUNNELING JUNCTION (MTJ) LAYER INCLUDING A TUNNELING FILM OF UNIFORM THICKNESS AND METHOD OF MANUFACTURING THE SAME

BACKGROUND OF THE INVENTION

1. Field of the Invention

The present invention relates to a semiconductor memory device and a method of manufacturing the same. More particularly, the present invention relates to a magnetic random access memory having a magnetic tunneling junction (MTJ) layer including a tunneling film of uniform thickness and a method of manufacturing the same.

2. Description of the Related Art

A magnetic random access memory (MRAM) is a memory device used to read and write data utilizing a property of resistance variation of a magnetic tunneling junction (MTJ) cell depending on a direction of magnetization of the MTJ cell. The MTJ cell includes a tunneling film and magnetic films on and under an insulating film.

MRAM is as highly integrated as a dynamic random access memory (DRAM) and capable of operating at high speed like a static random access memory (SRAM). In addition, MRAM can maintain data for a relatively long time without a refreshing process, similar to a flash memory device. Accordingly, MRAM has the advantages of both non-volatile and volatile memory devices.

Conventionally, an MRAM includes a transistor T and an MTJ layer electrically connected to the transistor. The transistor T performs a switching role, and data, i.e., "0" and "1", are recorded in the MTJ layer.

More specifically, referring to FIG. 1, which illustrates a cross-sectional view of a conventional MRAM, a conventional MRAM has a gate stack 12 containing a gate electrode on a substrate 10. Source and drain regions 14 and 16 are formed in the substrate 10 on opposite sides of the gate stack 12. The gate stack 12 and the source and the drain regions 14 and 16 formed on the substrate 10 constitute a transistor T. The transistor T is separated from adjacent transistors (not shown) by field oxide films 11 formed on the substrate 10. An interlayer insulating layer 18 covering the transistor T and the field oxide films 11 is formed on the substrate 10. A data line 20 is formed above the gate stack 12 in the interlayer insulating layer 18. The data line 20 is separated from and parallel to the gate stack 12. A contact hole 22 exposing the source region 14 is formed in the interlayer insulating layer 18. The contact hole 22 is filled with a conductive plug 24. A pad conductive layer 26 is formed on the interlayer insulating layer 18 in contact with a top surface of the conductive plug 24. The pad conductive layer 26 is formed above the data line 20. An MTJ layer S is formed on the pad conductive layer 26 directly above the data line 20. A second interlayer insulating layer 28 is formed covering the MTJ layer S and the pad conductive layer 26. A via hole 30 is formed in the second interlayer insulating layer 28 to expose the MTJ layer S. A bit line 32 is formed on the second interlayer insulating layer 28 perpendicular to the gate stack 12 and the data line 20. The bit line 32 is also formed in the via hole 30 to contact the MTJ layer S.

FIG. 2 illustrates a cross-sectional view of the conventional MTJ layer of the conventional MRAM depicted in FIG. 1. Referring to FIG. 2, the MTJ layer S of the conventional MRAM includes lower magnetic films S1, S2, and S3, a tunneling film S4, and upper magnetic films S5 and S6, stacked sequentially on the pad conductive layer 26. The lower magnetic films S1, S2, and S3 are a lower electrode S1, a pinning magnetic film S2, and a pinned magnetic film S3. The tunneling film S4 is an aluminum oxide film. The aluminum oxide film is formed by oxidation of an aluminum film formed on the pinned magnetic film S3 using one of a plasma oxidation method, a UV oxidation method, a natural oxidation method, and an ozone oxidation method. The upper magnetic films S5 and S6 are a free ferromagnetic film S5 and a capping film S6.

The conventional MRAM described above suffers from the following disadvantages. First, as depicted in FIG. 2, a grain boundary 34 that appears when forming the lower electrode S1 tends to extend to the tunneling film S4 through the pinning magnetic film S2 and the pinned magnetic film S3. If the grain boundary 34 extends through the pinned magnetic film S3, oxygen diffuses along the grain boundary 34 into the pinned magnetic film S3 and oxidizes an adjacent area of the pinned magnetic film S3 during the oxidation process for forming the tunneling film S4. This results in a difference in a thickness of the tunneling film S4 between the area contacting the grain boundary 34 and areas not contacting the grain boundary 34.

FIG. 3 is a tunneling electron microscope (TEM) image of the conventional MTJ layer depicted in FIG. 2 and shows this difference in thickness. In the MTJ layer shown in FIG. 3, the lower electrode S1 (not shown) is formed of Ta/Ru, the pinning magnetic film S2 (not shown) is formed of IrMn, and the pinned magnetic film S3 is formed of synthetic artificial ferromagnetic (SAF). The tunneling film S4 is an aluminum oxide film having a thickness of 15 Å, and the free ferromagnetic film S5 is formed of CoFe. As shown in FIG. 3, a thickness t2 of the tunneling film S4 where it contacts the grain boundary 34 is thicker than a thickness t1 of the tunneling film S4 where it does not contact the grain boundary 34.

If the thickness of the tunneling film S4 is not uniform, a thin area may cause a weak point. When a weak point exists in the tunneling film S4, current may concentrate on that weak point, which drastically reduces an insulation breakdown voltage of the tunneling film S4. Also, a switching uniformity decreases, and a cell resistance and a magnetoresistance (MR) could be reduced. Moreover, because the distribution of the grain boundary 34 generally differs from cell to cell, the distribution of the weak point also differs from cell to cell. Thus, each cell may have a different resistance. Therefore, deviation in resistance and MR between cells increases.

A second drawback of the conventional MRAM is that the tunneling film S4 is not flat. FIG. 4 is a schematic showing Neel coupling caused by waves, i.e., an uneven upper surface, in the tunneling oxide film S4 of the conventional MTJ layer depicted in FIG. 2. The tunneling film S4 depicted in FIG. 2 is drawn flat for simplicity, but, practically, the tunneling film S4 is not flat, as depicted in FIG. 4. Actually, the lower electrode S1 is formed with an uneven, i.e., wavy, upper surface. This wavy upper surface of the lower electrode S1 is transferred to the pinning magnetic film S2, the pinned magnetic film S3, and finally the tunneling film S4. Accordingly, the tunneling film S4 has the same wavy shape as the lower electrode S1. When the tunneling film S4 has a wavy surface, a switching field for switching the ferromagnetic film S5 is shifted widely by a Neel coupling between the pinned magnetic film S3 and the free ferromagnetic film S5. This problem may cause an error in the recording or reading of data.

FIG. 4 shows a problem caused by Neel coupling when waves having an amplitude of h and a frequency of λ are present on the tunneling film S4. In FIG. 4, $t_F$ represents a thickness of the free ferromagnetic film S5 stacked on the tunneling film S4, and $t_S$ represents a thickness of the tunneling film S4. $H_M$ represents a magnetic field for switching the free ferromagnetic film S5 (switching magnetic field). $H_N$ represents a magnetic field generated by Neel coupling due to the waves of the tunneling film S4 that causes a shift in the switching magnetic field (shift magnetic field). A degree of the shift in the switching magnetic field $H_M$ varies according to the magnitude of the shift magnetic field $H_N$.

The shift magnetic field $H_N$ due to Neel coupling can be expressed as the following formula:

$$H_N = \frac{\pi^2 h^2}{\sqrt{2}\,\lambda t_F} M_P \exp(-2\pi\sqrt{2}\, t_S/\lambda) \qquad (1)$$

A coupling energy density $J_N$ due to the presence of the shift magnetic field $H_N$ can be expressed as the following formula:

$$J_N = \frac{\pi^2 h^2}{\sqrt{2}\,\lambda} M_F M_P \exp(-2\pi\sqrt{2}\, t_S/\lambda) \qquad (2)$$

Referring to mathematical formulas 1 and 2, the shorter the wavelength $\lambda$ of the tunneling film S4, the larger the shift magnetic field $H_N$ and the coupling energy density $J_N$. Conversely, the longer the wavelength $\lambda$, the smaller the shift magnetic field $H_N$ and the coupling energy density $J_N$.

The shift magnetic field $H_N$ in the free ferromagnetic film S5 due to the unevenness of the tunneling film S4 in the conventional MTJ layer increases a coercivity of the free ferromagnetic film S5, and shifts the magnetic field for switching the free ferromagnetic film S5 by as much as the magnitude of the shift magnetic field $H_N$. This results in errors in recording or reading data of the MTJ layer, thereby diminishing the reliability of the conventional MRAM device.

SUMMARY OF THE INVENTION

The present invention is therefore directed to a magnetic random access memory having a magnetic tunneling junction (MTJ) layer including a uniform thickness tunneling film and a method of manufacturing the same, which substantially overcome one or more of the problems due to the limitations and disadvantages of the related art.

It is a feature of an embodiment of the present invention to provide a magnetic random access memory having a magnetic tunneling junction (MTJ) layer including a tunneling film of uniform thickness, and a method of manufacturing the same, that is able to reduce resistance deviation between cells, increase cell resistance and MR, and increase an insulation breakdown voltage.

It is another feature of an embodiment of the present invention to provide a magnetic random access memory having a magnetic tunneling junction (MTJ) layer including a tunneling film of uniform thickness, and a method of manufacturing the same, that is able to reduce the shift of the magnetic field of a free ferromagnetic film and the coercivity of the free ferromagnetic film, thereby recording and reading data more reliably.

At least one of the above and other features and advantages of the present invention may be realized by providing a magnetic random access memory (MRAM) including a cell including a transistor and a magnetic tunneling junction (MTJ) layer connected to the transistor, wherein the MTJ layer includes a lower electrode, a lower magnetic film, a tunneling film having a uniform thickness and a substantially flat upper surface, and an upper magnetic film, wherein the lower electrode includes a first lower electrode and an amorphous second lower electrode.

The first lower electrode may be one of a metal electrode and a metal compound electrode having a substantially flat upper surface. The amorphous second lower electrode may be one of an amorphous metal electrode and an amorphous metal compound electrode.

The amorphous metal compound film may be an amorphous RE-TM compound film.

According to another aspect of the present invention, there is provided a magnetic random access memory (MRAM) including a cell including a transistor and a magnetic tunneling junction (MTJ) layer connected to the transistor, wherein the MTJ layer includes a lower electrode, a flattening film, a lower magnetic film, a tunneling film having a uniform thickness and a substantially flat upper surface, and an upper magnetic film.

The lower electrode may be one of a metal electrode and a metal compound electrode having a substantially flat upper surface. The flattening film may be one of an amorphous metal film and an amorphous metal compound film. The amorphous metal compound film may be an amorphous RE-TM compound film.

At least one of the above and other features and advantages of the present invention may be realized by providing method of manufacturing a magnetic random access memory (MRAM) having a cell including a transistor and a magnetic tunneling junction (MTJ) layer connected to the transistor, the method including sequentially forming a first lower electrode and an amorphous second lower electrode on a pad layer connected to the transistor, forming a lower magnetic film on the amorphous second lower electrode, forming a tunneling film having a uniform thickness and a substantially flat upper surface on the lower magnetic film, forming an upper magnetic film on the tunneling film, and patterning the films stacked on the pad layer with a predetermined pattern by etching the stacked films in reverse order.

The second lower electrode may be one of an amorphous metal electrode and an amorphous metal compound electrode. The amorphous metal compound film may be an amorphous RE-TM compound film.

The method may further include flattening an upper surface of the first lower electrode prior to forming the second lower electrode.

At least one of the above and other features and advantages of the present invention may be realized by providing a method of manufacturing a magnetic random access memory (MRAM) having a cell including a transistor and a magnetic tunneling junction (MTJ) layer connected to the transistor, the method including forming a lower electrode on a pad layer connected to the transistor, forming a flattening film on the lower electrode, forming a lower magnetic film on the flattening film, forming a tunneling film having a uniform thickness and a substantially flat upper surface on the lower magnetic film, forming an upper magnetic film on the tunneling film, and patterning the films stacked on the pad layer in a predetermined pattern by etching the stacked films in reverse order.

The flattening film may be one of an amorphous metal film and an amorphous metal compound film. The amorphous metal compound film may be an amorphous RE-TM compound film.

In any of the above embodiments, the tunneling film may be one selected from the group consisting of an aluminum oxide (AlO$_x$) film, an aluminum hafnium oxide (Al$_x$Hf$_{1-x}$O$_y$) film, a magnesium oxide (MgO) film, an yttrium oxide (YO$_x$) film, and a calcium fluorine (CaF$_x$) film.

In an MRAM according to an embodiment of the present invention, since the tunneling film has a uniform thickness and a substantially flat upper surface, i.e., without waves, resistance deviation between cells may be reduced, cell resistance and MR may be increased, and insulation breakdown voltage may be increased. Further, since a shift magnetic field H$_N$ due to Neel coupling can be reduced, the shift of the magnetic field of a free ferromagnetic film and the coercivity of the free ferromagnetic film may be reduced. Therefore, data is recorded and read more reliably.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
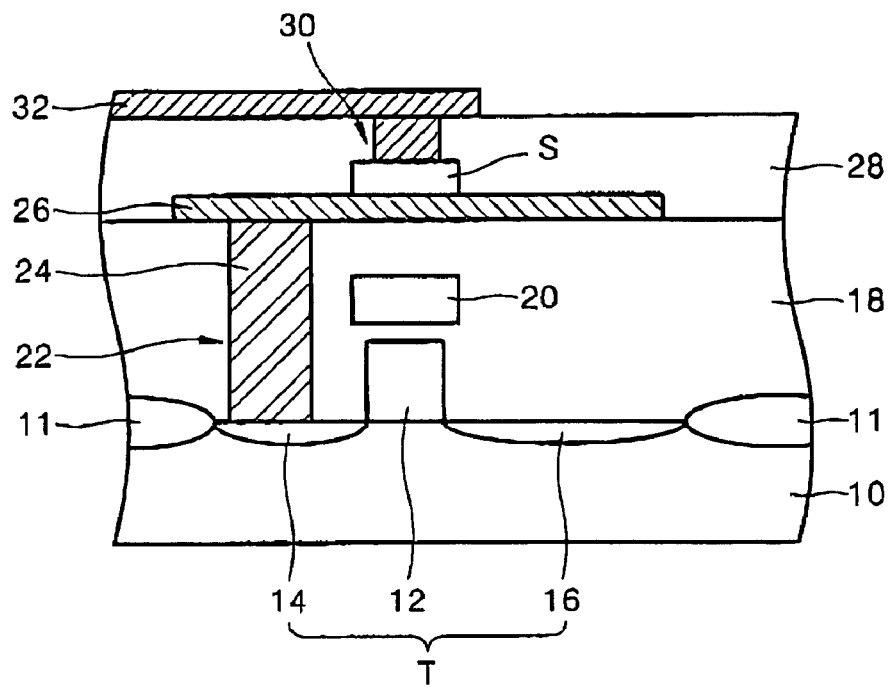
FIG. 1 illustrates a cross-sectional view of a conventional MRAM.

Korean Patent Application No. 2003-66952, filed on Sep. 26, 2003, in the Korean Intellectual Property Office, and entitled: "Magnetic Random Access Memory Comprising MTJ Layer Having Tunneling Film with Uniform Thickness and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 5:
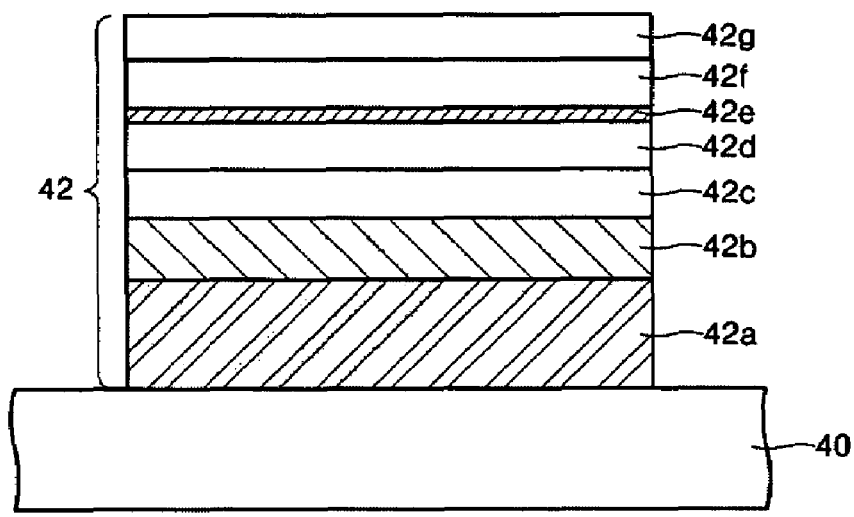
FIG. 5 illustrates a cross-sectional view of an MTJ layer according to an embodiment of the present invention.

FIG. 5 illustrates a cross-sectional view of an MTJ layer according to an embodiment of the present invention.

Referring to FIG. 5, a magnetic tunneling junction (MTJ) layer 42, which is formed on a pad layer 40, e.g., a conductive pad layer, includes a lower electrode (seed film) 42a, a flattening film 42b, a pinning ferromagnetic layer 42c, a pinned ferromagnetic layer 42d, a tunneling film having a uniform thickness without waves 42e, i.e., having a substantially flat upper surface, a free ferromagnetic film 42f, and a capping film 42g, stacked sequentially. The conductive pad layer 40 is connected to a source of a MOSFET (not shown), which is a switching means.

The lower electrode 42a may be formed of a single or a double film of a conductive material, such as metal, e.g., tantalum (Ta), titanium (Ti), or tantalum/ruthenium (Ta/Ru). Alternatively, the lower electrode 42a may be formed of a metal compound, such as titanium nitride (TiN) or titanium/titanium nitride (Ti/TiN). When the lower electrode 42a is formed of a metal compound, the surface of the electrode is preferably flattened.

The flattening film 42b prevents the layers subsequently stacked on the lower electrode 42a from adopting a wave shape of the lower electrode 42a. The size of waves formed on the lower electrode 42a decreases from a lower surface of the flattening film 42b to an upper surface of the flattening film 42b. Resultantly, the upper surface of the flattening film 42b is substantially flat and does not exhibit a wave shape. Accordingly, surfaces of the pinning ferromagnetic film 42c and the pinned ferromagnetic film 42d, which are stacked sequentially on the flattening film 42b, are substantially flat. Since the tunneling film 42e is formed on the flat surface of the pinned ferromagnetic film 42d, the tunneling film 42e does not exhibit a wave shape, i.e., is substantially flat, and has a uniform thickness. The flattening film 42b may be an amorphous metal film, an amorphous metal compound film, such as a CoZrNb film (CZN film), or an amorphous RE-TM compound film, such as a CoTb film, a CoFeTb film, or a CoZr film. Alternatively, the material of the flattening film does not necessarily have to be amorphous, depending on the material forming the lower electrode.

Figure 2:
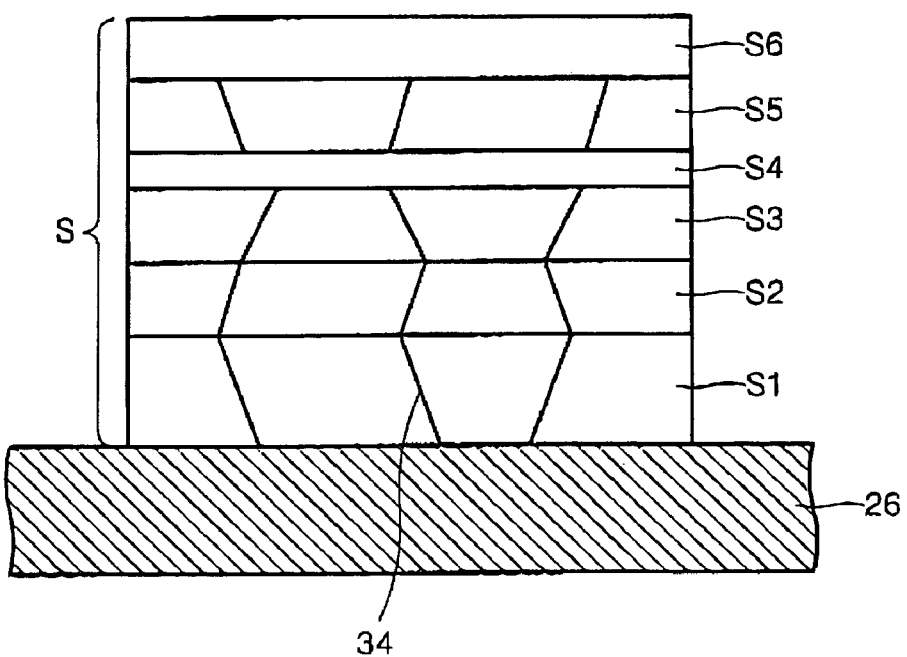
FIG. 2 illustrates a cross-sectional view of a conventional magnetic tunnel junction (MTJ) layer of the conventional MRAM depicted in FIG. 1.
Figure 3:
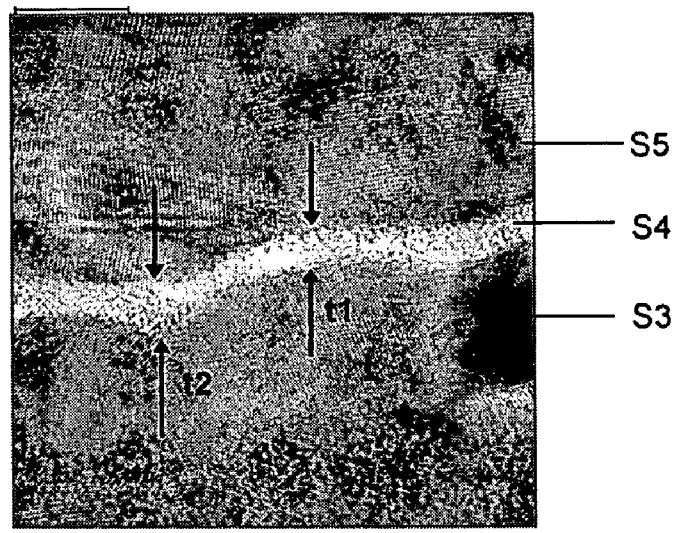
FIG. 3 is a tunneling electron microscope (TEM) image of the conventional MTJ layer depicted in FIG. 2.
Figure 4:
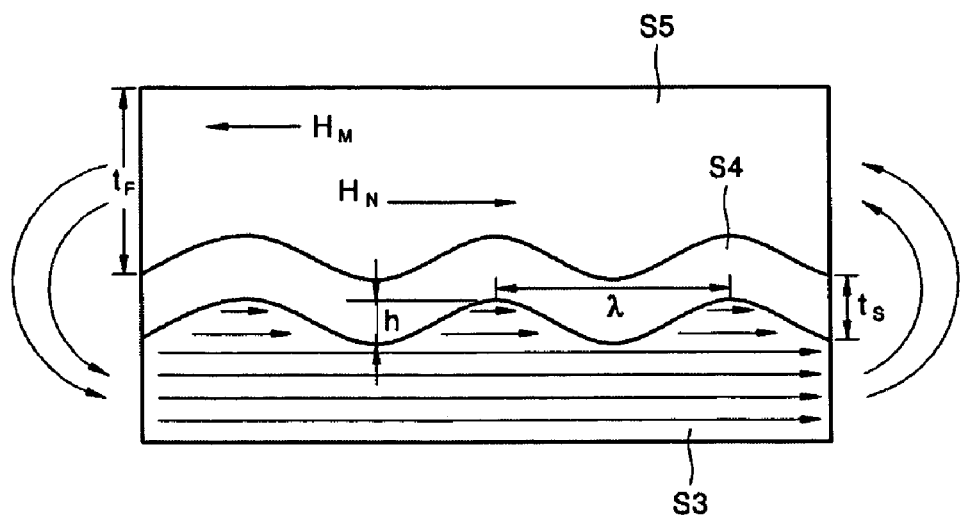
FIG. 4 is a schematic showing Neel coupling caused by waves, i.e., an uneven upper surface, in a tunneling oxide film of the conventional MTJ layer depicted in FIG. 2.

Since the flattening film 42b is formed of small grains, it prevents grain boundaries 34, which could be formed when forming the lower electrode 42a as depicted in FIG. 2, from extending to the layers stacked on the flattening film 42b.

The tunneling film 42e is able to have a uniform thickness without exhibiting a wave shape due to the flattening film 42b.

The tunneling film 42e may be formed of one of an aluminum oxide film ($AlO_x$), an aluminum hafnium oxide ($Al_xHf_{1-x}O_y$) film, a magnesium oxide (MgO) film, an yttrium oxide ($YO_x$) film, and a calcium fluorine ($CaF_x$) film. Alternatively, the tunneling film 42e may be replaced by a non-oxide film performing the same function as the oxide film.

Alternatively, the lower electrode 42a and the flattening film 42b can be integrated into an electrode. In this case, the lower electrode 42a is a first lower electrode, and the flattening film 42b is a second lower electrode. The pinning ferromagnetic film 42c and the pinned ferromagnetic film 42d can be integrated into a lower magnetic film, and the free ferromagnetic film 42f and the capping film 42g can be integrated into an upper magnetic film.

Figure 6:
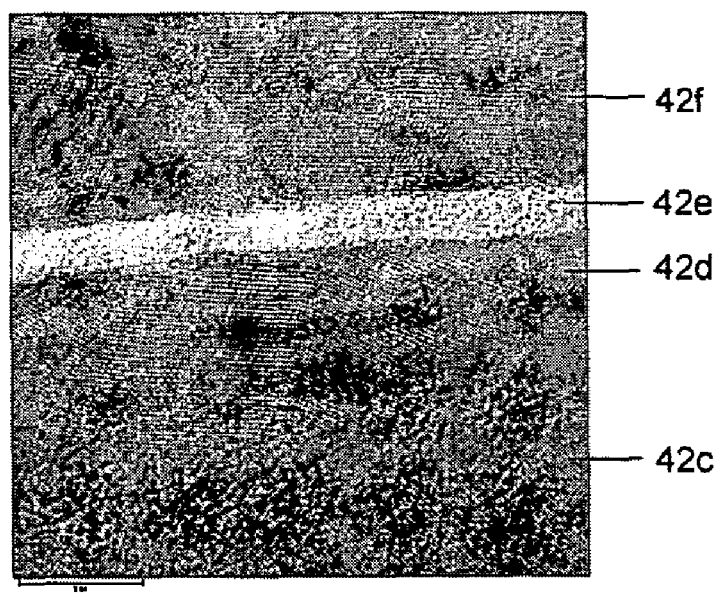
FIG. 6 is a TEM image of a portion of the MTJ layer depicted in FIG. 5.

FIG. 6 is a TEM image of a portion of a material film containing the tunneling film 42e of the MTJ layer depicted in FIG. 5 according to an embodiment of the present invention. Referring to FIG. 6, it is seen that the thickness of the tunneling film 42e is uniform in all regions and does not exhibit a wave shape.

Referring back to mathematical formulas 1 and 2, it is seen that as the wavelength λ becomes larger, the shift magnetic field $H_N$ and the coupling energy density $J_N$ become smaller. Moreover, at a wavelength λ of infinity, i.e., when the tunneling film 42e does not exhibit a wave shape, i.e., has a substantially flat upper surface, and has uniform thickness, the shift magnetic field $H_N$ and the coupling energy density $J_N$ become zero. As shown in FIG. 6, the tunneling film 42e of the MTJ layer of the present invention does not exhibit a wave shape. Accordingly, the wavelength λ in mathematical formulas 1 and 2 can be set to infinity, thus the shift magnetic field $H_N$ and the coupling energy density $J_N$ due to Neel coupling in the MTJ layer 42e of the present invention can be neglected.

Figure 7:
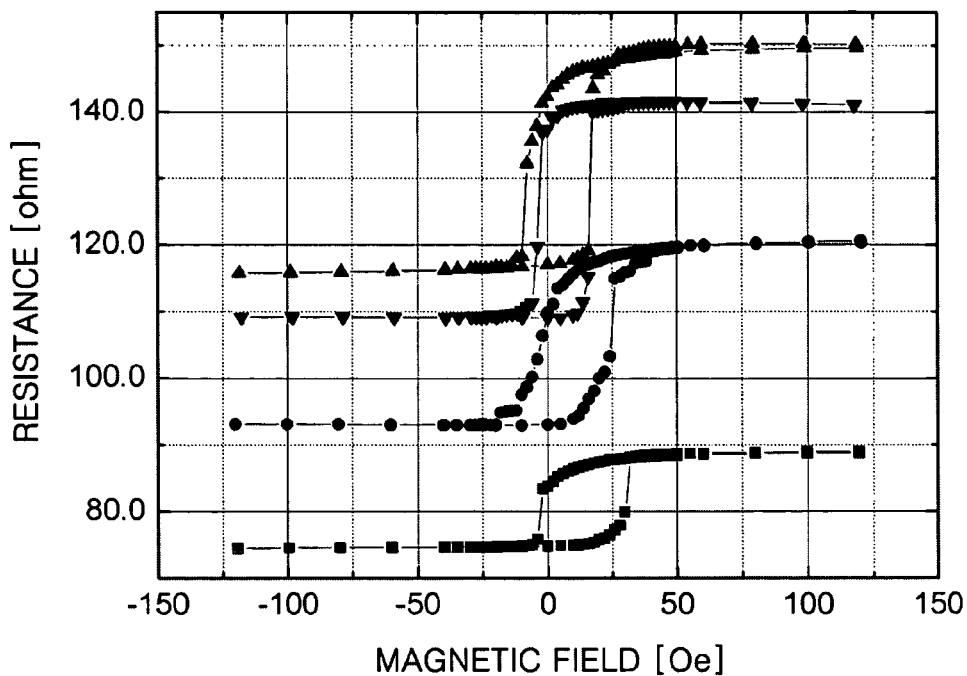
FIG. 7 is a graph showing resistance characteristic versus magnetic field for a conventional MRAM having a conventional MTJ layer and for three (3) different MRAMs having an MTJ layer according to an embodiment of the present invention.

FIG. 7 is a graph showing resistance characteristic versus magnetic field for a conventional MRAM having a conventional MTJ layer and for three (3) different MRAMs having an MTJ layer according to an embodiment of the present invention. In FIG. 7, symbol ■ represents the resistance characteristic of the conventional MRAM in which the lower electrode, the pinning magnetic film, and the pinned magnetic film of the MTJ layer are formed of Ta/Ru, IrMn, and SAF, respectively. Symbol ● represents the resistance characteristic of a first MRAM according to an embodiment of the present invention in which the lower electrode, the flattening film, the pinning ferromagnetic film, and the pinned ferromagnetic film of the MTJ layer are formed of Ta/Ru, CZN, IrMn, and SAF, respectively (hereinafter referred to as a first resistance characteristic). Symbol ▼ represents the resistance characteristic of a second MRAM according to an embodiment of the present invention in which the lower electrode, the flattening film, the pinning ferromagnetic film, and the pinned ferromagnetic film of the MTJ layer are formed of Ta, CZN (38 Å), IrMn, and SAF, respectively (hereinafter referred to as a second resistance characteristic). Symbol ▲ represents the resistance characteristic of a third MRAM according to an embodiment of the present invention in which the lower electrode, the flattening film, the pinning ferromagnetic film, and the pinned ferromagnetic film of the MTJ layer are formed of Ta, CZN (14 Å), IrMn, and SAF, respectively (hereinafter referred to as a third resistance characteristic).

Referring to FIG. 7, it is seen that the resistance characteristic of the first through the third MRAMs according to an embodiment of the present invention is superior to the resistance characteristic of the conventional MRAM. Also, it is seen that the resistance characteristic against the magnetic field improves from the first resistance characteristic to the third resistance characteristic.

Figure 8:
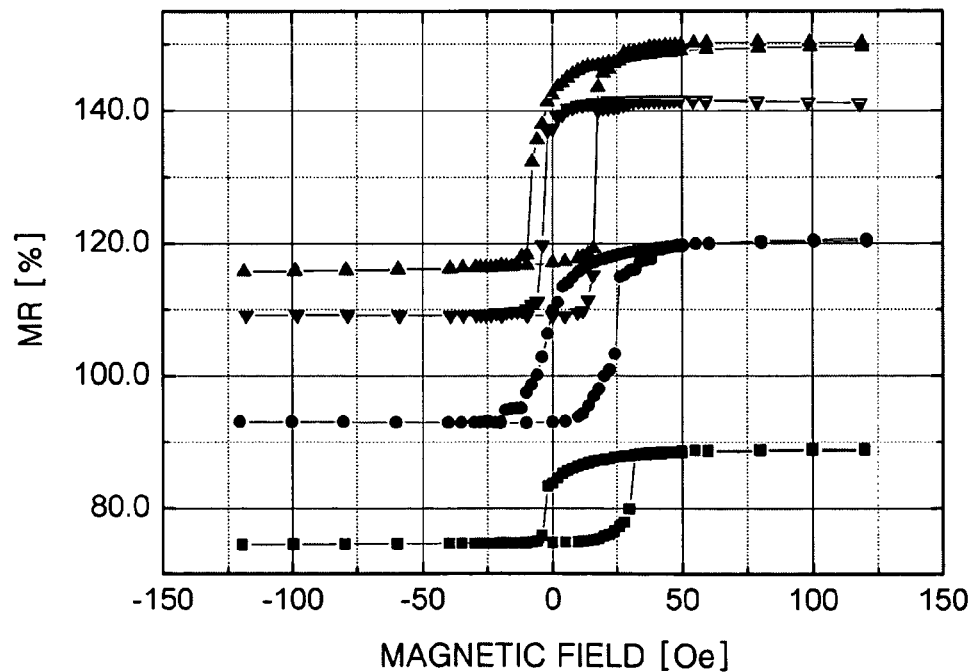
FIG. 8 is a graph showing MR characteristic versus magnetic field for a conventional MRAM having a conventional MTJ layer and for three (3) different MRAMs having an MTJ layer according to an embodiment of the present invention.

FIG. 8 is a graph showing magnetoresistance (MR) characteristic versus magnetic field for a conventional MRAM having a conventional MTJ layer and for three (3) different MRAMs having an MTJ layer according to an embodiment of the present invention. It can be seen in FIG. 8 that the MR characteristics of the MRAMs according to the present invention (■, ▲, and ▼) are superior to the MR characteristic of the conventional MRAM (■). That is, the MR of the MRAM of the present invention is significantly larger than that of the conventional MRAM. In FIG. 8, symbol ■ represents the conventional MRAM in which the lower electrode, the pinning ferromagnetic film, and the pinned ferromagnetic film of the MTJ layer are formed of a Ta/Ru film, an IrMn film, and a SAF film, respectively. Symbol ● represents the first MRAM according to an embodiment of the present invention in which the lower electrode, the flattening film, the pinning ferromagnetic film, and the pinned ferromagnetic film of the MTJ layer are formed of Ta/Ru, CZN, IrMn, and SAF, respectively. Symbol ▼ represents the second MRAM according to an embodiment of the present invention in which the lower electrode, the flattening film, the pinning ferromagnetic film, and the pinned ferromagnetic film of the MTJ layer are formed of Ta, CZN (38 Å), IrMn, and SAF, respectively. Symbol ▲ represents the third MRAM according to an embodiment of the present invention in which the lower electrode, the flattening film, the pinning ferromagnetic film, and the pinned ferromagnetic film of the MTJ layer are formed of Ta, CZN (14 Å), IrMn, and SAF, respectively.

Figure 9:
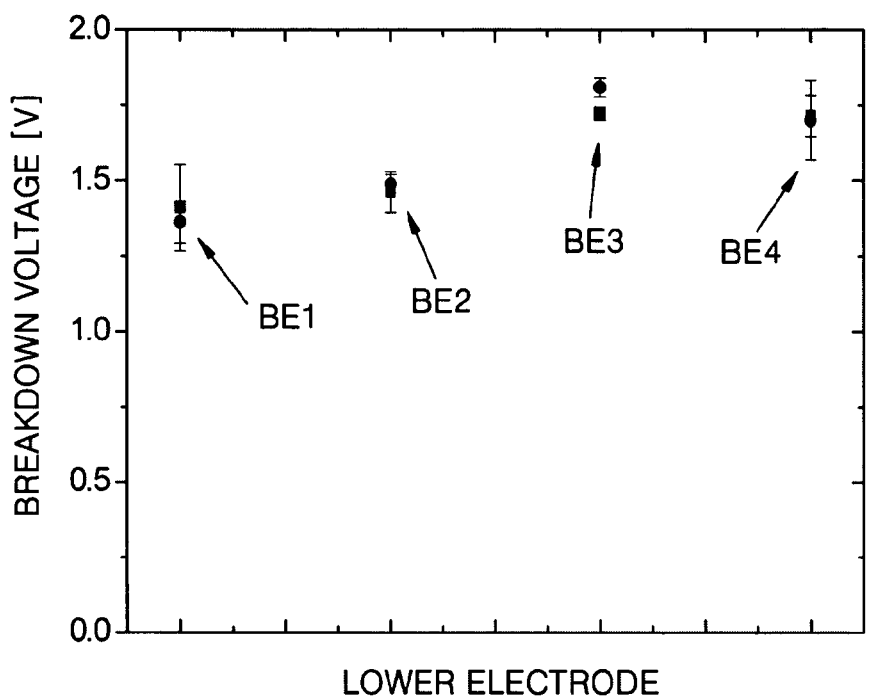
FIG. 9 is a graph showing insulation breakdown voltage for a conventional MRAM having a conventional MTJ layer and for three (3) different MRAMs having an MTJ layer according to an embodiment of the present invention.

FIG. 9 is a graph showing insulation breakdown voltage for a conventional MRAM having a conventional MTJ layer and for three (3) different MRAMs having an MTJ layer according to an embodiment of the present invention. In FIG. 9, BE1 represents the conventional MRAM in which the lower electrode is formed of Ta/Ru. BE2 represents an MRAM according to an embodiment of the present invention in which the lower electrode is formed of Ta/Ru/CZN (14 Å) (hereinafter referred to as a first insulation breakdown voltage). BE3 represents an MRAM according to an embodiment of the present invention in which the lower electrode is formed of Ta/CZN (14 Å) (hereinafter referred to as a second insulation breakdown voltage). BE4 represents an MRAM according to an embodiment of the present invention in which the lower electrode is formed of Ta/CZN (38 Å) (hereinafter referred to as a third insulation breakdown voltage).

Referring to FIG. 9, it is seen that the insulation breakdown voltage BE1 according to the conventional art is 1.4 V, while the first insulation breakdown voltage BE2 is 1.5 V, which is slightly higher than that of the conventional MRAM. It is also seen that the second insulation breakdown voltage BE3 is 1.7-1.8 V, which is much higher than BE1 of the conventional art, and the third insulation breakdown voltage BE4 is 1.5-1.8 V. Accordingly, it may be seen that the insulation breakdown voltages of the MRAM of the present invention, in all cases, are higher than the insulation breakdown voltage of the conventional MRAM.

Figure 10:
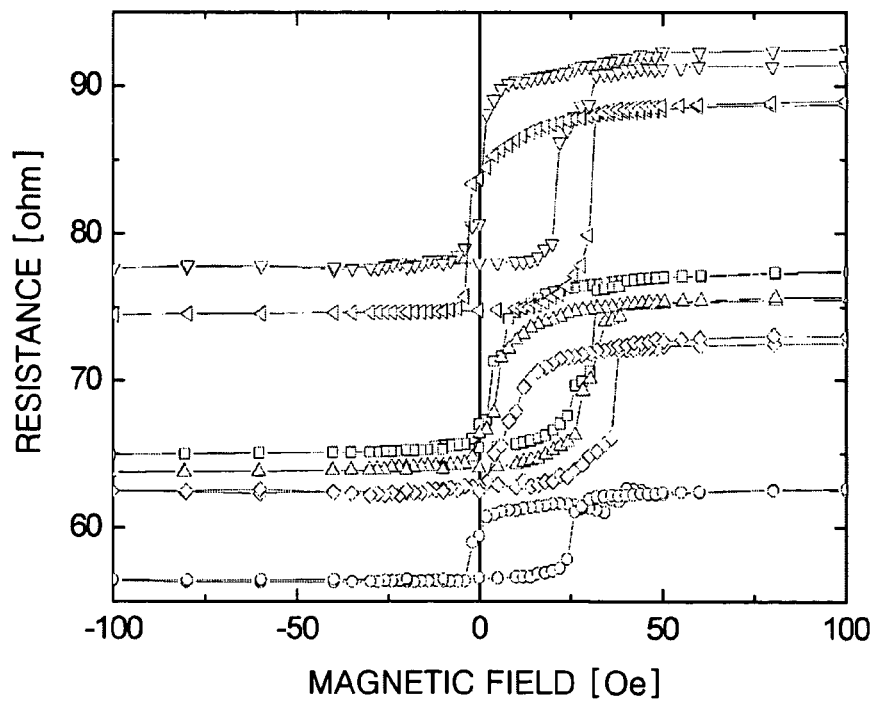
FIG. 10 is a graph showing resistance deviation of a conventional MRAM containing a conventional MTJ layer.
Figure 11:
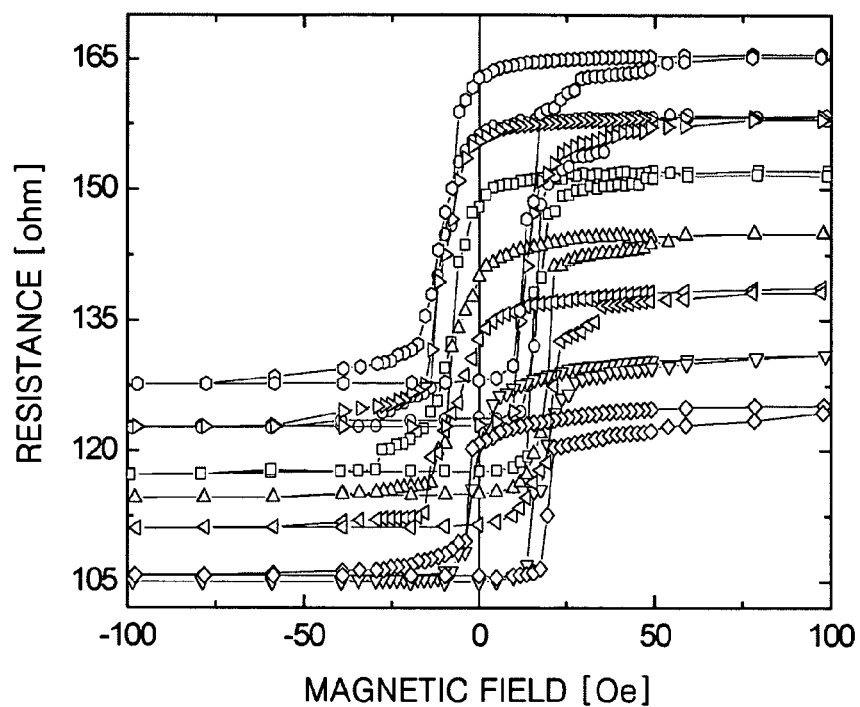
FIGS. 11 and 12 are graphs showing resistance deviation of two (2) different MRAMs having an MTJ layer according to an embodiment of the present invention.
Figure 12:
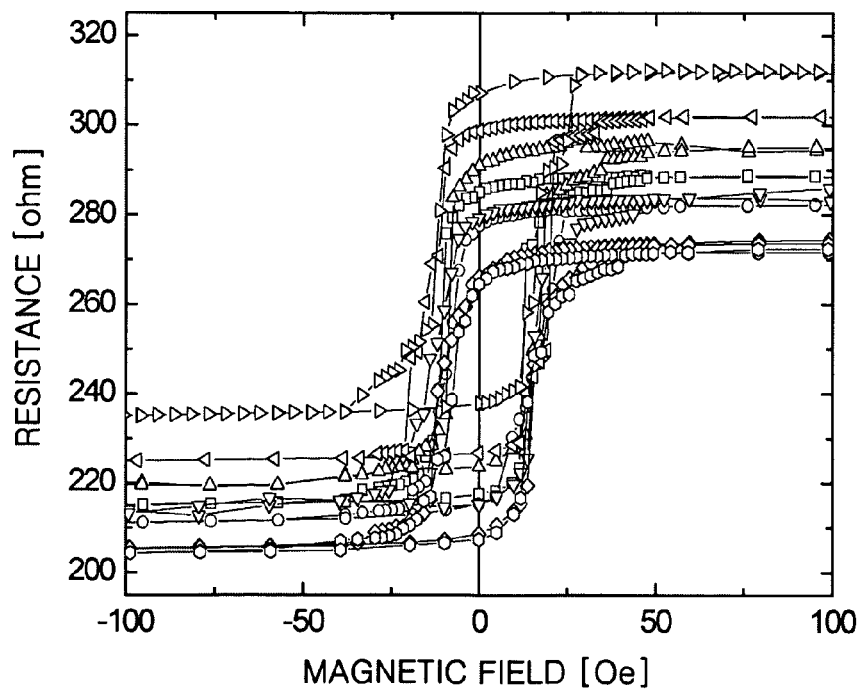

FIG. 10 is a graph showing resistance deviation of a conventional MRAM containing a conventional MTJ layer in which the lower electrode is formed of Ta/Ru. FIGS. 11 and 12 are graphs showing resistance deviation of two (2) different MRAMs having an MTJ layer according to an embodiment of the present invention. More specifically, FIG. 11 shows resistance deviation (hereinafter referred to as a first resistance deviation) between MRAMs formed according to an embodiment of the present invention in which the lower electrode is formed of Ta/CZN and FIG. 12 shows resistance deviation (hereinafter referred to as a second resistance deviation) between MRAMs formed according to an embodiment of the present invention in which the lower electrode is formed of flattened TiN and CZN. Table 1 summarizes the resistance deviation data plotted in FIGS. 10 through 12.

TABLE 1

| Lower electrode | Mean | STD | STD/Resistance | Remark |
| --- | --- | --- | --- | --- |
| Ta/Ru | 66.56 | 8.00 | 0.12 | Conventional art |
| Ta/CZN | 115.48 | 6.98 | 0.06 | Present invention |
| Flattened TiN/ CZN | 217.57 | 9.86 | 0.05 | Present invention |

Referring to Table 1, it is seen that the second resistance deviation (9.86) is larger than the resistance deviation of the conventional MRAM. However, the magnitude of the mean resistance (217.57) related to the second resistance deviation is significantly larger than the mean resistance (66.56) of the conventional MRAM.

Therefore, it is preferable to consider the ratio of STD to R of MRAM by the present invention with the ratio of STD to R of the conventional MRAM as tabulated in the fourth column of Table 1 rather than to compare STD of MRAM by the present invention with STD of the conventional MRAM.

It can be seen that the ratio of the resistance deviation (8.00) to the overall resistance (66.56) of the conventional MRAM is 0.12, while the ratio of the second resistance deviation (9.86) to the mean resistance (217.57) of the present invention is only 0.05. Also, the ratio of the first resistance deviation (6.98) to the mean resistance (115.48) of the present invention is 0.06. These results show that the resistance deviations between the MRAMs according to the present invention are significantly lower than the resistance deviation of the conventional MRAM.

Table 2 summarizes the MR deviation data of the MRAMs according to the conventional art and an embodiment of the present invention.

TABLE 2

| Lower electrode | Mean MR | STD | STD/MR | Remark |
| --- | --- | --- | --- | --- |
| Ta/Ru | 17.58 | 3.16 | 0.18 | Conventional art |
| Ta/CZN | 27.47 | 2.23 | 0.08 | Present invention |
| Flattened TiN/ CZN | 34.10 | 0.80 | 0.02 | Present invention |

Referring to Table 2, it is seen that the mean MRs between the MRAMs of the present invention are larger than the mean MR between the conventional MRAMs. However, the standard deviations and the ratios of the standard deviation to the mean MR between the MRAMs of the present invention are all smaller than those of the conventional MRAM. From these results, it can be said that the MR-related characteristics of the MRAMs according to the present invention are considerably superior to the MR-related characteristics of the conventional art.

A method of manufacturing an MRAM having an MTJ layer according to an embodiment of the present invention as depicted in FIG. 5 will now be described. The MRAM of the present invention, prior to the formation of the MTJ layer, can be formed according to a conventional method. Therefore, the following description begins with formation of an MTJ layer on a conductive pad connected to a MOSFET.

<First Embodiment>

Figure 13:
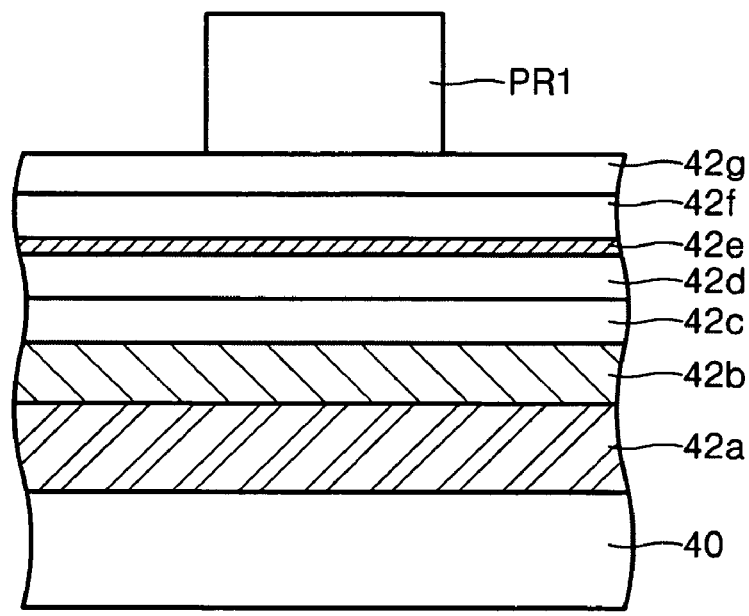
FIGS. 13 and 14 illustrate cross-sectional views of stages in a method of forming an MRAM according to a first embodiment of the present invention.
Figure 14:
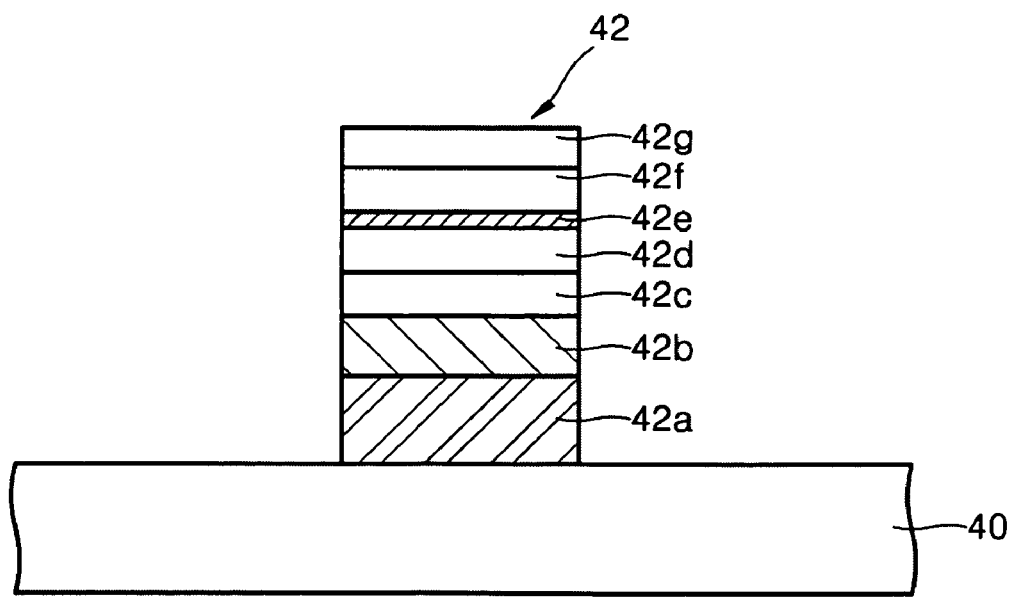

FIGS. 13 and 14 illustrate cross-sectional views of stages in a method of forming an MRAM according to a first embodiment of the present invention. Referring to FIG. 13, the lower electrode 42a is formed on the conductive pad layer 40 connected to a source region of a MOSFET. The lower electrode 42a may be formed of a conductive, e.g., metal, electrode made of a single film or a stacked double film. When the lower electrode 42a is formed of a single film, it is preferably formed of a metal such as tantalum, but may be formed of another metal. When the lower electrode 42a is formed of a double film, it is preferably formed of metals such as tantalum/ruthenium, but may be formed of other metals. The flattening film 42b is formed on the lower electrode 42a to a predetermined thickness. The flattening film 42b can be used as a part of the lower electrode. In this case, the lower electrode 42a is a first lower electrode, and the flattening film 42b is a second lower electrode. The flattening film 42b may be formed of an amorphous metal, or an amorphous RE-TM compound selected from the group consisting of CZN, CoTb, CoFeTb, and CoZr. The flattening film 42b may be formed of small grains. Therefore, grain boundaries of the lower electrode 42a are prevented from extending into the above layers when the flattening film 42b is formed on the lower electrode 42a. The pinning ferromagnetic film 42c and the pinned ferromagnetic film 42d, which together form a lower magnetic film, are formed sequentially on the flattening film 42b. The pinning ferromagnetic film 42c may be formed of a compound magnetic film such as an IrMn film. The pinned ferromagnetic film 42d may be formed of an SAF film. The lower magnetic film, composed of the pinning ferromagnetic film 42c and the pinned ferromagnetic film 42d, can be formed by sequential stacking an IrMn film, a CoFe film, a Ru film, and a CoFe film.

Next, the tunneling film 42e is formed on the pinned ferromagnetic film 42d to a predetermined thickness. Waves in, i.e., a wave shape of, the lower electrode 42a do not affect the shape of the above layers, and the grain boundary of the lower electrode 42a does not enter into the above layers, due to the flattening film 42b. Accordingly, the tunneling film 42e can be formed with a uniform thickness, without waves or weak points, over the entire region of the tunneling film 42e. The tunneling film 42e may be an aluminum oxide film ($AlO_x$), but may also be one of an aluminum hafnium oxide film ($Al_xHf_{1-x}O_y$), a magnesium oxide (MgO) film, an yttrium oxide ($YO_x$) film, and a calcium fluorine ($CaF_x$) film. The free ferromagnetic film 42f and the capping film 42g are sequentially formed on the tunneling film 42e. The free ferromagnetic film 42f may be a double film formed of a compound containing iron (Fe) selected from the group consisting of CoFe, and CoFe and NiFe. The capping film 42g may be formed of a ruthenium (Ru) film, or may be formed of another metal film or metal compound film. A first photosensitive film PR1 is formed on the capping film 42g. The first photosensitive film PR1 defines a region for forming an MTJ layer according to an embodiment of the present invention. The exposed portion of the capping film 42g is etched using the first photosensitive film PR1 as an etching mask. The etching continues until the conductive pad layer 40 is exposed. Then, the first photosensitive film PR1 is removed by ashing and stripping. Afterward, washing and drying processes are performed. Resultantly, an MTJ layer 42 according to a first embodiment of the present invention is formed on the conductive pad layer 40 as depicted in FIG. 14.

<Second Embodiment>

In the second embodiment, descriptions of processes common to the first embodiment are not repeated.

Figure 15:
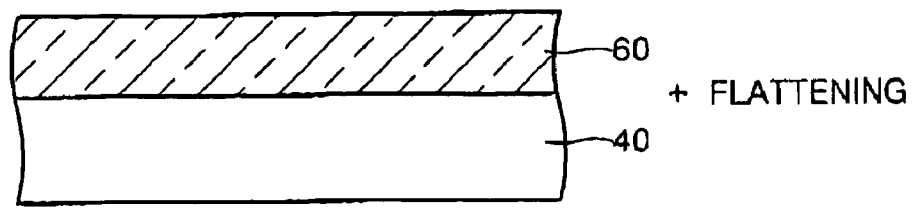
FIGS. 15 through 17 illustrate cross-sectional views of stages in a method of forming an MRAM according to a second embodiment of the present invention.
Figure 16:
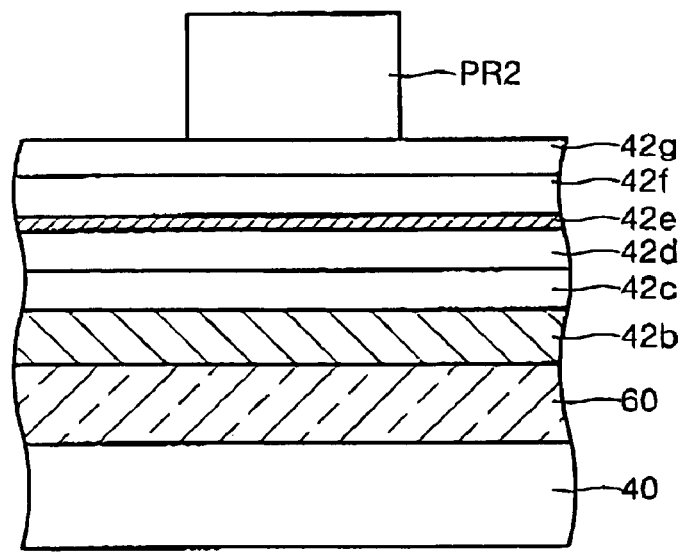
Figure 17:
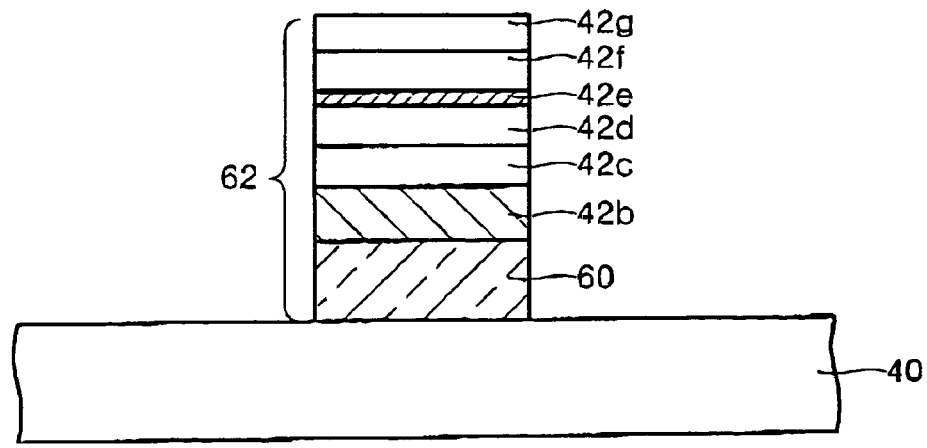

FIGS. 15 through 17 illustrate cross-sectional views of stages in a method of forming an MRAM according to a second embodiment of the present invention. Referring to FIG. 15, a lower electrode 60 is formed on the conductive pad layer 40. The lower electrode 60 may be formed of a metal compound electrode, such as a titanium nitride (TiN) electrode. Subsequently, an upper surface of the lower electrode 60 is flattened. While it is preferable to use a chemical mechanical polishing method to flatten the upper surface of the lower electrode 60, other flattening methods may be used.

Referring now to FIG. 16, after flattening the upper surface of the lower electrode 60, the flattening film 42b is formed on the lower electrode 60. Then, the pinning and pinned ferromagnetic films 42c and 42d, the tunneling film 42e, the free ferromagnetic film 42f, and the capping film 42g, are formed sequentially. Next, a second photosensitive film PR2 is formed on the capping film 42g. Then, the stacked films are sequentially etched using the second photosensitive film PR2 as an etching mask until the conductive pad layer 40 is exposed. After removing the second photosensitive film PR2, washing and drying processes are performed.

Resultantly, the MTJ layer 62, including the lower electrode 60 formed of metal compounds having a flattened surface, and the flattening film 42b formed on the lower electrode 60, is formed on the conductive pad layer 40.

As described above, an MRAM according to an embodiment of the present invention includes a flattening film on a lower electrode (seed film) for preventing stacked layers above the lower electrode from adopting a wave shape of the lower electrode, and for preventing grain boundaries formed in the lower electrode from extending into the layers stacked on the lower electrode. Thus, due to the flattening film, a tunneling film having a uniform thickness without waves or weak points can be formed between a lower magnetic film and an upper magnetic film. Accordingly, in an MRAM according to an embodiment of the present invention, resistance deviation between cells is reduced, and cell resistance, MR, resistance to area (RA), and insulation breakdown voltage are increased. In addition, since the shift magnetic field $H_N$ caused by Neel coupling is reduced, the shift of the magnetic field of the free ferromagnetic film and the coercivity of the free ferromagnetic film is reduced. Therefore, data reading/recording reliability can be increased.

Exemplary embodiments of the present invention have been disclosed herein and, although specific terms are employed, they are used and are to be interpreted in a generic and descriptive sense only and not for purpose of limitation. For example, the upper magnetic film and the lower magnetic film of the MTJ layer may be formed in a different way. In addition, when oxidizing a metal film for forming the tunneling film, a means to prevent the material films under the metal film from oxidizing may be developed. Accordingly, it will be understood by those of ordinary skill in the art that various changes in form and details may be made without departing from the spirit and scope of the present invention as set forth in the following claims.

What is claimed is:

1. A magnetic random access memory (MRAM) comprising a cell including a transistor and a magnetic tunneling junction (MTJ) layer connected to the transistor, wherein the MTJ layer includes:
    a lower electrode including a first lower electrode and an amorphous second lower electrode, the amorphous second lower electrode formed of an amorphous RE-TM compound including a rare earth element and a transition metal element;
    a pinning ferromagnetic film on the amorphous second lower electrode;
    a pinned ferromagnetic film on the pinning ferromagnetic film;
    a tunneling film having a uniform thickness and a substantially flat upper surface; and
    an upper magnetic film.

2. The MRAM as claimed in claim 1, wherein the first lower electrode is one of a metal electrode and a metal compound electrode having a substantially flat upper surface.

3. The MRAM as claimed in claim 1, wherein the tunneling film is one selected from the group consisting of an aluminum oxide ($AlO_x$) film, an aluminum hafnium oxide ($Al_xHf_{1-x}O_y$) film, a magnesium oxide (MgO) film, an yttrium oxide ($YO_x$) film, and a calcium fluorine ($CaF_x$) film.

4. The MRAM as claimed in claim 1, wherein the amorphous RE-TM compound includes Tb.

5. A magnetic random access memory (MRAM) comprising a cell including a transistor and a magnetic tunneling junction (MTJ) layer connected to the transistor, wherein the MTJ layer includes:
    a lower electrode;
    a flattening film;
    a lower magnetic film;
    a tunneling film having a uniform thickness and a substantially flat upper surface; and
    an upper magnetic film,
    wherein the flattening film includes an amorphous RE-TM compound including a rare earth element and a transition metal element, and
    wherein the lower magnetic film includes a pinning ferromagnetic film on the flattening film, and a pinned ferromagnetic film on the pinning ferromagnetic film.

6. The MRAM as claimed in claim 5, wherein the lower electrode is one of a metal electrode and a metal compound electrode having a substantially flat upper surface.

7. The MRAM as claimed in claim 5, wherein the RE-TM compound includes Tb.

8. The MRAM as claimed in claim 5, wherein the tunneling film is one selected from the group consisting of an aluminum oxide ($AlO_x$) film, an aluminum hafnium oxide ($Al_xHf_{1-x}O_y$) film, a magnesium oxide (MgO) film, an yttrium oxide ($YO_x$) film, and a calcium fluorine ($CaF_x$) film.

9. A method of manufacturing a magnetic random access memory (MRAM) comprising a cell including a transistor and a magnetic tunneling junction (MTJ) layer connected to the transistor, the method comprising:
    sequentially forming a first lower electrode and an amorphous second lower electrode on a pad layer connected to the transistor, wherein the amorphous second lower electrode is formed of an amorphous RE-TM compound including a rare earth element and a transition metal element;
    forming a lower magnetic film on the amorphous second lower electrode;
    forming a tunneling film having a uniform thickness and a substantially flat upper surface on the lower magnetic film;
    forming an upper magnetic film on the tunneling film; and
    patterning the films stacked on the pad layer with a predetermined pattern by etching the stacked films in reverse order, wherein forming the lower magnetic film includes:
    forming a pinning ferromagnetic film on the amorphous second lower electrode, and
    forming a pinned ferromagnetic film on the pinning ferromagnetic film.

10. The method of manufacturing an MRAM as claimed in claim 9, wherein the amorphous RE-TM compound includes Tb.

11. The method of manufacturing an MRAM as claimed in claim 9, wherein the tunneling film is one selected from the group consisting of an aluminum oxide ($AlO_x$) film, an aluminum hathium oxide ($Al_xHf_{1-}O_y$) film, a magnesium oxide (MgO) film, an yttrium oxide ($YO_x$) film, and a calcium fluorine ($CaF_x$) film.

12. The method of manufacturing an MRAM as claimed in claim 9, further comprising flattening an upper surface of the first lower electrode prior to forming the second lower electrode.

13. A method of manufacturing a magnetic random access memory (MRAM) comprising a cell including a transistor and a magnetic tunneling junction (MTJ) layer connected to the transistor, the method comprising:
    forming a lower electrode on a pad layer connected to the transistor;
    forming a flattening film on the lower electrode;
    forming a lower magnetic film on the flattening film;
    forming a tunneling film having a uniform thickness and a substantially flat upper surface on the lower magnetic film;
    forming an upper magnetic film on the tunneling film; and
    patterning the films stacked on the pad layer in a predetermined pattern by etching the stacked films in reverse order, wherein:
    the flattening film includes an amorphous RE-TM compound including a rare earth element and a transition metal element, and
    forming the lower magnetic film includes:
        forming a pinning ferromagnetic film on the flattening film; and
        forming a pinned ferromagnetic film on the pinning ferromagnetic film.

14. The method of manufacturing an MRAM as claimed in claim 13, wherein the amorphous RE-TM compound includes Tb.

15. The method of manufacturing an MRAM as claimed in 13, wherein the tunneling film is one selected from the group consisting of an aluminum oxide ($AlO_x$) film, an aluminum hafnium oxide ($Al_xHf_{1-}O_y$) film, a magnesium oxide (MgO) film, an yttrium oxide ($YO_x$) film, and a calcium fluorine ($CaF_x$) film.

* * * * *